United States Patent [19]
Koch et al.

[11] Patent Number: 5,144,637
[45] Date of Patent: Sep. 1, 1992

[54] INLINE DIPLEX LIGHTWAVE TRANSCEIVER

[75] Inventors: Thomas L. Koch, Holmdel; Herwig Kogelnik, Rumson; Uziel Koren, Fair Haven, all of N.J.

[73] Assignee: AT&T Bell Laboratories, Murray Hill, N.J.

[21] Appl. No.: 517,103

[22] Filed: Apr. 30, 1990

[51] Int. Cl.$^5$ .............................. H01S 3/19
[52] U.S. Cl. ........................ 372/50; 357/19; 385/14; 359/113
[58] Field of Search ............... 372/50, 7, 8; 357/19, 357/16, 30; 385/14, 88; 359/113, 114, 152

[56] References Cited
U.S. PATENT DOCUMENTS

| | | | |
|---|---|---|---|
| 4,653,058 | 3/1987 | Akiba et al. | 372/50 |
| 4,730,330 | 3/1988 | Plihal et al. | 372/50 |
| 4,860,294 | 8/1989 | Winzer et al. | 372/50 |

OTHER PUBLICATIONS

C. M. Lawson et al., Elec. Lett., vol. 20, No. 23, Nov. 8, 1984, "In-Line Single-Mode Wavelength Division . . . ", pp. 963–964.
R. D. Hall et al., Elec, Lett., vol. 21, No. 14, Jul. 4, 1985, "Bidirectional Transmission Over 11 km of Single . . . ", pp. 628–629.
M. Stern et al., Elec. Lett., vol. 21, No. 20, Sep. 26, 1985, "Bidirectional LED Transmission on Single-mode Fibre . . . ", pp. 928–929.
M. Kawachi et al., IGWO 1986, FDD5, "Hybrid Optical Integration with High-silica Channel Waveguides on Silicon", pp. 62–64.
C. Cremer et al., Elec. Lett., vol. 23, No. 7, Mar. 26, 1987, "InGaAsP Y-Branch Grating Demultiplexer", pp. 321–322.
A. R. Hunwicks et al., Elec. Lett., vol. 23, No. 10, May 7, 1987, "Duplex-Diplex Optical Transmission in the 1300 nm . . . ", pp. 542–544.
U. Koren et al., IGWO 1989, MDD2, "Processes for Large Scale Photonic Integrated Circuits", pp. 68–71.
Y. Kanabar et al., Elec. Lett., vol. 25, No. 13, Jun. 22, 1989, "Demonstration of Novel Optical Multichannel . . . ", pp. 817–819.
F. Hernandez-Gil et al., Elec. Lett., vol. 25, No. 19, Sep. 14, 1989, "Tunable MQW-DBR Laser with Monolithically . . . ", pp. 1271–1272.
T. L. Koch et al., Elec. Lett., vol. 25, No. 24, Nov. 23, 1989, "GaInAs/GaInAsP Multiple-Quantum-Well Integrated . . . ", pp. 1621–1623.
R. F. Kazarinov et al., Integrated Photonics Res. Conf., Hilton Head 1990, "Four-channel Wavelength-division Multiplexers . . . ", p. 121.
C. Bornholdt et al., Integrated Photonics Res. Conf., Hilton Head 1990, "Wavelength Multiplexer/Demultiplexers Based on . . . ", p. 122.

Primary Examiner—William D. Larkins
Attorney, Agent, or Firm—G. C. Ranieri

[57] ABSTRACT

Full duplex lightwave communications is achieved in a diplex transceiver realized in a semiconductor photonic integrated circuit having an inline interconnecting waveguide integral with the transmitting and receiving portions of the transceiver. Semiconductor lasers and detectors operating in different wavelength regimes permit diplex or wavelength-division-multiplexed operation. In the transceiver, lightwave signals from the laser propagate through the detector without interfering with the detector operation or the lightwave signals being detected.

8 Claims, 3 Drawing Sheets

ACTIVE    PASSIVE

INLINE DIPLEX LIGHTWAVE TRANSCEIVER

CROSS-REFERENCE TO RELATED APPLICATION

This application is related to co-pending and commonly assigned U.S. patent application Ser. No. 516,413 filed Apr. 30, 1990, now U.S. Pat. No. 5,031,188.

TECHNICAL FIELD

This invention relates to semiconductor devices and, more particularly, to devices employed as transmitters and receivers in lightwave communication systems.

BACKGROUND OF THE INVENTION

Wavelength-division-multiplexing (WDM) affords bidirectional communications and multiple channel communications over a single optical fiber link in a lightwave communication system. For an exemplary bidirectional system between two end stations, each station transmits at an assigned wavelength. See, for example, *Elect. Lett.*, Vol. 21, No. 20, pp. 928-9 (1985). In order to receive signals from the remote end station, the receiver must operate at a wavelength different from the assigned transmitter wavelength. Separate waveguides connect the transmitter and the receiver to the optical fiber. Wavelength blocking filters and wavelength selective or routing couplers have been used to direct lightwave signals from the optical fiber to the receiver and from transmitter to the optical fiber.

By employing WDM, it is possible to design around crosstalk between signals of significantly differing strengths, namely, the high optical power signal from the transmitter and the relatively low optical power signal to the receiver. Unfortunately, receiver interference is caused by near end crosstalk from Fresnel reflections and Rayleigh backscattering of lightwave signals from the optical fiber. Receiver interference degrades receiver sensitivity and impairs WDM system performance. While WDM techniques offer the potential for bidirectional transmission on a single optical fiber, it is clear that realization of a WDM system is costly and architecturally complex. Both cost and complexity combine to make these techniques unattractive for communication systems having a large number of stations such as local area networks and "fiber to the home" applications.

SUMMARY OF THE INVENTION

Full duplex lightwave communications is achieved in a diplex transceiver realized in a semiconductor photonic integrated circuit having an inline interconnecting waveguide integral with the transmitting and receiving portions of the transceiver. Semiconductor lasers and detectors operating in different wavelength regimes permit diplex or wavelength-division-multiplexed operation. In the transceiver, lightwave signals from the laser propagate through the detector without interfering with the detector operation or the lightwave signals being detected.

In one exemplary embodiment, a longer wavelength laser or source is integrated with a shorter wavelength detector. The longer wavelength lightwave signals of the laser propagate in a direction contrary to the shorter wavelength signals for the detector in the region of the detector without affecting detector operation. This permits outgoing signals to be transmitted from the same end (facet) of the transceiver as incoming signals are received.

BRIEF DESCRIPTION OF THE DRAWING

A more complete understanding of the invention may be obtained by reading the following description of a specific illustrative embodiment of the invention in conjunction with the appended drawing in which.

It should be noted that the drawings have not been drawn to scale in order to achieve more clarity and understanding witrh respect to the features of the present invention.

DETAILED DESCRIPTION

Figure 1:
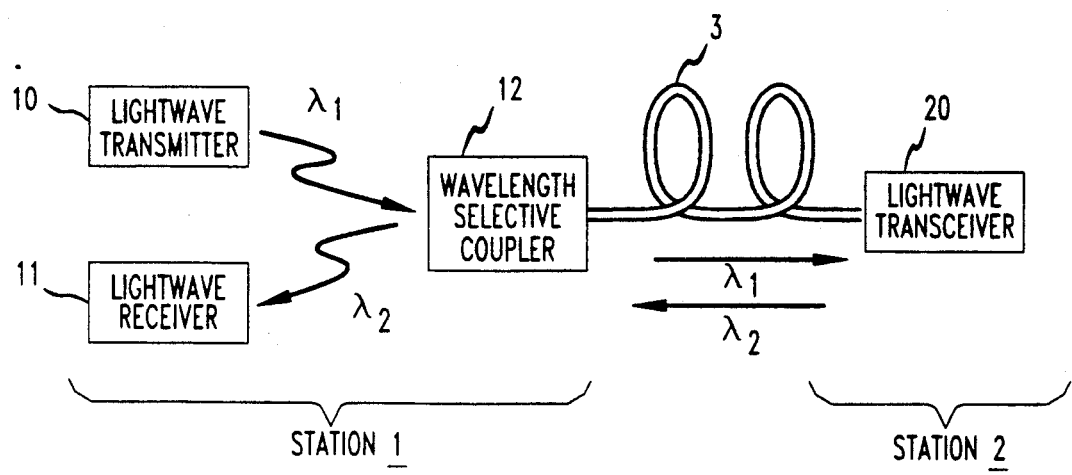
FIG. 1 shows a simplified block diagram of a wavelength-division-multiplexed lightwave communication system realized in accordance with the principles of the present invention.

A bidirectional lightwave communication system having at least two end stations is shown in simplified block diagram form in FIG. 1. Each end station modulates a lightwave signal at one wavelength with data while receiving a lightwave signal from the remote end station at a different wavelength.

End station 1 comprises lightwave transmitter 10, lightwave receiver 11, and wavelength selective coupler 12. End station 2 comprises lightwave transceiver 20 which is realized in accordance with the principles of the invention as described in more detail below. End station 1 communicates with end station 2 over single optical fiber 3. Bidirectional transmission over the optical fiber is achieved because the end stations are transmitting lightwave signals to each other at two mutually exclusive wavelengths, namely, $\lambda_1$ and $\lambda_2$. That is, $\lambda_1$ is not equal to $\lambda_2$. An exemplary system could be realized with $\lambda_1$ at 1.3 $\mu$m and $\lambda_2$ at 1.5 $\mu$m. The relative directions of signals at wavelengths $\lambda_1$ and $\lambda_2$ are shown by directed arrows under optical fiber 3.

Wavelength selective coupler 12 is employed to direct the lightwave signal received on optical fiber 3 from transceiver 20 at wavelength $\lambda_2$ to lightwave receiver 11. Also, wavelength selective coupler 12 serves as an interface for lightwave signals at wavelength $\lambda_1$ from lightwave transmitter 10 to optical fiber 3.

In accordance with the principals of invention, lightwave transceiver 20 is realized as a photonic integrated circuit in which the lightwave transmitter and lightwave receiver are individually integrated in an inline geometry with a single waveguide. The single waveguide supports propagation of lightwave signals at wavelengths $\lambda_1$ and $\lambda_2$. For the exemplary embodiments shown below, $\lambda_1$ is chosen to be a shorter wavelength than $\lambda_2$. It should be clear from the description provided below especially with reference to FIGS. 2, 3, and 5 that lightwave signals at both wavelengths counter propagate through the waveguide at least in the region associated with the lightwave receiver shown as a 1.3 $\mu$m detector. In the FIGS. cited above, the long wavelength lightwave transmitter is shown as a 1.5 $\mu$m laser. In general, lightwave signals enter through an emanate from one and only one end of the waveguide in the photonic integrated circuit comprising lightwave transceiver 20.

In the various embodiments described herein, the photonic integrated transceiver circuit incorporates all the processing simplicity of a single laser, and puts all the optics needed at one end station of a $\lambda_1/\lambda_2$ bidirectional link onto a single chip with a single waveguide fiber coupling port. The transceiver has successfully operated in 200 Mb/s bidirectional lightwave communications link with only a ~1 dB crosstalk penalty and sufficient margin for transmission over more than 30 km using only 50Ω amplifiers connected directly to the detector portions of the transceivers.

Figure 2:
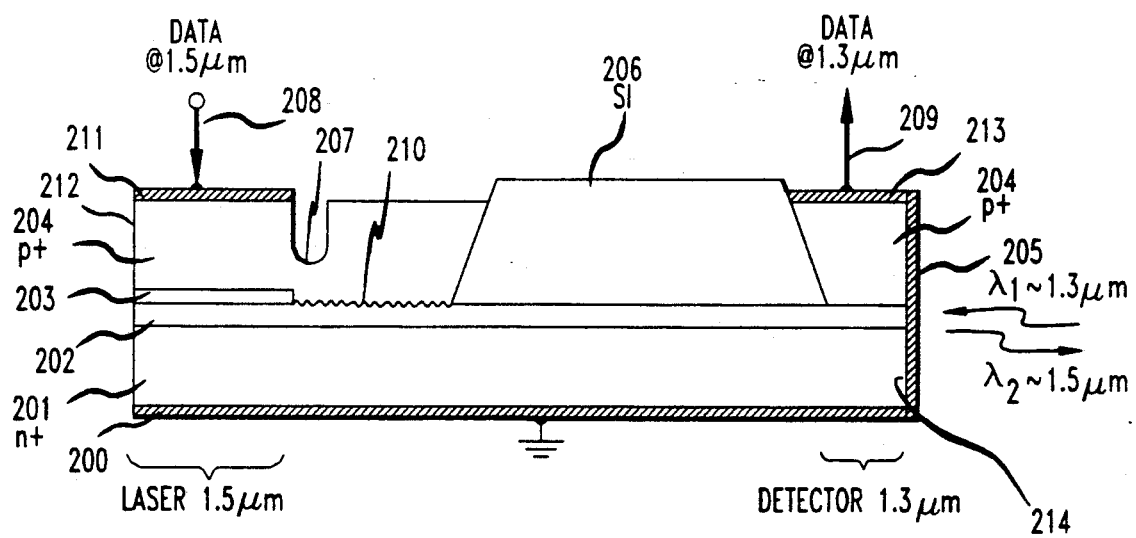
FIGS. 2, 3, and 5 show cross-sectional views of exemplary semiconductor heterostructure arrangements for realizing the inline diplex lightwave transceiver in accordance with the principles of the present invention.

A basic exemplary design for lightwave transceiver 20 is shown FIG. 2. This embodiment includes a long wavelength laser and a short wavelength detector. In order to achieve the desired transmit and receive functions for this transceiver, material absorption properties are utilized by a judicious arrangement of different semiconductor materials to form the single waveguide underlying and integrated with the transmit and receive devices. This is contrast to prior art technologies in which different wavelength signals were separated onto physically separate waveguides by interferometric or grating-based wavelength routing techniques.

Conventional semiconductor heterostructure growth techniques are employed to form the photonic integrated circuit shown in FIG. 2 as well as those shown in the subsequent figures. One such technique is described in U.S. patent application Ser. No. 237,251 filed Aug. 26, 1988. The teachings of this application are expressly incorporated herein by reference. This technique has also been described in the following technical article: *Technical Digest of the Topical Meeting on Integrated and Guided Wave Optics*, paper MDD2 (1989).

The semiconductor heterostructure shown in FIG. 2 comprises a plurality of layers wherein substrate and lower cladding layer 201 is an n+ InP layer having a thickness of ~1.35 μm and a dopant concentration of approximately $10^{18}$ cm$^{-3}$; inline waveguide layer 202 is a substantially undoped InGaAsP having a thickness of ~0.3 μm and a set of mole fractions x and y ($In_{1-x}Ga_xAs_yP_{1-y}$) suitable for achieving a photoluminescence peak substantially at the shorter wavelenght $\lambda_1$; gain layer 203 in the laser section is a substantially undoped InGaAsP layer having a thickness of ~0.07 μm and a set of mole fractions suitable for achieving a photoluminescence peak substantially at the longer wavelength $\lambda_2$; upper cladding layer 204 is a p+ InP layer having a thickness of ~1.5 μm and a dopant concentration of approximately $5 \times 10^{17}$ cm$^{-3}$; and electrical isolation layer 206 includes semi-insulating InP to a sufficient thickness for achieving electrical isolation between the detector and the laser. It is understood that each cladding layer comprises material having a lower refractive index than the inline waveguide layer in order to form a low loss optical waveguide.

In the laser portion of the transceiver, electrical connection is made through contacts 211 and 200; in the detector portion of the transceiver, electrical connection is made through contacts 213 and 200. Standard metallic contacts are contemplated for use in this device. Conventional photolithographic masking and contact deposition techniques are employed to form contacts 200, 211, and 213. Signals for the longer wavelength laser are applied to the laser via lead 208. Signals from the shorter wavelength detector are received via lead 209. While data signals are depicted in the FIG., it is understood that analog and digital signals, either separately or in combination, are anticipated for use with the present invention.

The laser cavity is defined in the present embodiment by end facet 212 and diffraction grating 210. While end facet 212 may be uncoated or passivated, it is contemplated that the end facet may also be coated with standard metallic or dielectric coatings to increase or decrease the reflectivity from end facet 212.

The laser shown in FIG. 2 is a distributed Bragg reflector laser. Diffraction grating 210 is a distributed Bragg reflector grating which is patterned on the upper surface of inline waveguide layer 202 using conventional techniques such as holographic resist exposure and wet chemical etching. Placement of the grating is also contemplated to be on the upper surface of substrate and lower cladding layer 201 in the same position longitudinally as shown in the FIG. In the latter configuration, the grating is positioned beneath the inline waveguide layer. When the grating length is relatively short compared to several Bragg lengths, diffraction grating 210 is partially transmitting and functions as an output coupler of the 1.5 μm laser. In this configuration, the laser injects its lightwave signal at $\lambda_2$ into the shorter wavelength passive inline waveguide at $\lambda_1$. Eventually the longer wavelength lightwave signal emerges from end facet 214, which is preferably coated with anti-reflection coating material shown as layer 205, for transmission on an optical fiber, for example, of a bidirectional communications link. Anti-reflection coating is desirable to avoid formation of an additional reflector for the laser signals at $\lambda_2$ and to eliminate loss due to Fresnel reflections for signals at $\lambda_1$ which are entering the waveguide.

Groove 207 is formed in the upper cladding layer to provide electrical isolation for the contact 211 and termination for the gain region so that the diffraction grating 210 remains substantially unpumped. This groove is formed by various methods such as wet etching or reactive ion beam processing.

Electrical isolation between transmitter contact 211 and detector contact 209 is desirable in a photonic integrated circuit such as this. Electrical isolation can be achieved in a number of ways such as ion implantation, or by channel etching, or by growth of a semi-insulating material layer between the laser and detector sections. In particular, this latter technique is employed without additional crystal growth steps by using a processing sequence such as the previously described in U.S. patent application Ser. No. 237,251. Semi-insulating InP (Fe or Ti doped) upper cladding layers can be formed in certain regions as shown while the same semi-insulating material growth provides lateral current blocking in certain other regions such as lateral regions around the laser. While it is important to provide materials for good electrical isolation, it is preferred to utilize materials which substantially match the refractive index properties of the upper cladding layer so that unwanted perturbations of the propagating signals are avoided along the inline waveguide.

It should be understood that, for processing simplification, layer 203 includes a thin (~200Å) InP stop-etch layer separating the two quaternary layers to allow selective removal of the gain layer quaternary material by using conventional masking and material selective etching techniques.

In an alternative embodiment, layer 203 comprises multiple quantum wells where the barrier (wide bandgap) material is InGaAs and the well (narrow bandgap) material is InGaAsP having the proper mole fractions to achieve a photoluminescence peak substantially at $\lambda_2$. One exemplary embodiment of this alternative structure includes the InGaAs/InGaAsP multiple quantum well stack consisting of four 80Å wells and 100Å barriers which is positioned on top of a 1.3 μm bandgap InGaAsP inline waveguide. The multiple quantum well stack provides gain through its overlap with the edge of the optical mode in this multi-layer waveguide in the longitudinal sections which contain the multiple quantum well stack. It is desirable to separate the multiple quantum well stack from the 1.3 μm quaternary inline waveguide by a thin (~200Å) InP etch-stop layer which allows the selective removal of the stack using simple material-selective wet chemical etches.

As presently understood, the principle used in this bidirectional photonic integrated transceiver circuit is based on a fundamental property of the wide bandgap passive inline waveguide. This property is the ability of this guide to be a low loss transmitting or transparent waveguide at the longer wavelength $\lambda_2 = 1.5$ μm but, concurrently, to be strongly absorbing for incoming signals at the shorter wavelength of $\lambda_1 = 1.3$ μm. As a result, when the incoming signal is coupled into the inline waveguide from end facet 214 adjacent the detector, it is absorbed within a short distance L, where L is inversely proportional to the material absorption coefficient $\alpha$ at the wavelength of interest, that is, for 1.3 μm material at 1.3 μm wavelength. Typically, L is less than approximately 100 μm. Absorption constitutes the generation of electron-hole pairs across the bandgap. If the end region is properly contacted and biased in a p-n junction configuration as shown, this end section will constitute a shorter wavelength (1.3 μm) waveguide photodetector. Due to its small junction area, such detectors can be made with low capacitance for high speed and high sensitivity operation. At the same time that the waveguide photodetector is detecting the weaker incoming signal at wavelength $\lambda_1$, it experiences the higher intensity local transmitting signal at wavelength $\lambda_2$ passing directly through the detector absorbing layer. In accordance with the principles of the present invention, properly sequencing of materials having appropriate band edge absorption properties allows an intimate integration of lightwave transmitter and receiver functions in a simple in-line geometry without interference, wherein the transmitter and receiver are designed for different wavelength operating regimes.

Figure 3:
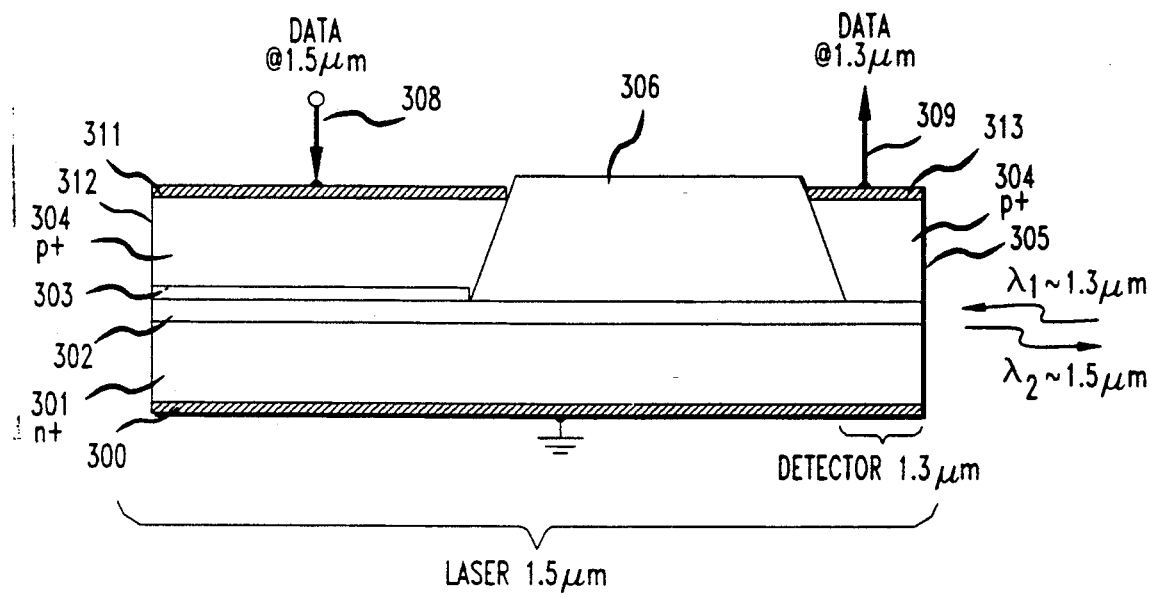
Figure 4:
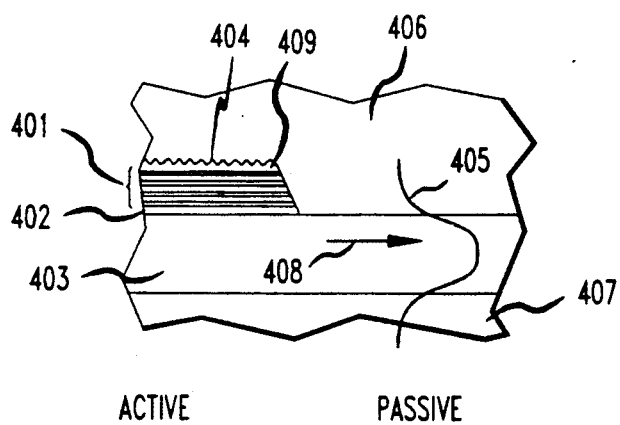
FIG. 4 shows an exemplary transition from an active device to a passive waveguide as employed in the arrangements of FIGS. 2, 3, and 5.

While it is expected that the detector (p-i-n) structure and the distributed Bragg reflector laser structure are desirable, many different structures for the laser are contemplated. These structures include Fabry-Perot and distributed feedback (DFB) lasers as shown in FIGS. 3 and 4, respectively. Although not shown in the drawing, it is contemplated that the distributed Bragg reflector structure in FIG. 1 be modified to include an additional Bragg reflector in place of the end facet. Also, many of the multi-electrode and multi-section DBR and DFB laser structures are contemplated for use herein.

A simpler version of the photonic integrated transceiver circuit can be made to include a simple Fabry-Perot laser cavity. In this version, the end facets cannot be anti-reflection coated, at least at the longer wavelength $\lambda_2$ (1.5 μm). End facet 305 is required for the laser feedback/output coupler mirror. A narrowband wavelength anti-reflection coating at the shorter wavelength $\lambda_1$ (1.3 μm) could be applied to end facet 305 to permit this facet to remain reflective at the longer wavelength $\lambda_2$ (1.5 μm). In the event that no coating is applied to this end facet, it is expected that there will be a small loss for the incoming signal as a result of facet reflection. In this implementation the short wavelength detector is actually inside the cavity of the long wavelength transmitter laser. Simplification gained by eliminating diffraction gratings comes at the expense of possibly higher crosstalk penalties due to the larger optical power density for the long wavelength signal as it traverses the short wavelength detector. Other anticipated losses may come from the above-mentioned potential Fresnel losses for the incoming signal.

The semiconductor heterostructure shown in FIG. 3 comprises a plurality of layers wherein substrate and lower cladding layer 301 is an n+ InP layer; inline waveguide layer 302 is a substantially undoped InGaAsP having a set of mole fractions x and y ($In_{1-x}Ga_xAs_yP_{1-y}$) suitable for achieving a photoluminescence peak substantially at the shorter wavelength $\lambda_1$; gain layer 303 in the laser section is a substantially undoped InGaAsP layer having a set of mole fractions suitable for achieving a photoluminescence peak substantially at the longer wavelength $\lambda_2$; upper cladding layer 304 is a p+ InP layer; and electrical isolation layer 306 includes semi-insulating InP to a sufficient thickness for achieving electrical isolation between the laser and detector. It is understood that each cladding layer comprises material having a lower refractive index than the inline waveguide layer in order to form a low loss optical waveguide.

In the laser portion of the transceiver, electrical connection is made through contacts 311 and 300; in the detector portion of the transceiver, electrical connection is made through contacts 313 and 300. Signals for the longer wavelength laser are applied to the laser via lead 308. Signals from the shorter wavelength detector are received via lead 309.

A cutaway view of an exemplary distributed feedback laser section is shown in FIG. 4. This laser may be substituted in the photonic integrated transceiver circuit shown in FIG. 2. In this laser structure, grating 404 could be either above or below the guide in the longitudinal region containing the gain layer.

The portion of the semiconductor heterostructure shown in FIG. 4 comprises a plurality of layers wherein substrate and lower cladding layer 407 is an n+ InP layer; inline waveguide layer 403 is a substantially undoped InGaAsP having a set of mole fractions x and y ($In_{1-x}Ga_xAs_yP_{1-y}$) suitable for achieving a photoluminescence peak substantially at the shorter wavelength $\lambda_1$; gain layer 401 in the laser section is a substantially undoped InGaAs/InGaAsP quantum well stack layer having a set of mole fractions suitable for achieving a photoluminescence peak substantially at the longer wavelength $\lambda_2$; layer 409 may be a thin etch-stop InP layer for permitting placement of grating 404; upper cladding layer 406 is a p+ InP layer; and a thin etch-stop layer 402 of InP between the gain layer and the inline waveguide layer. It is understood that each cladding layer comprises material having a lower refractive index than the inline waveguide layer in order to form a low loss optical waveguide. The optical mode of the signal from the laser and its direction are designated with reference numerals 405 and 408, respectively. The active/passive butt-coupling shown is capable of achieving 95% coupling efficiency.

Figure 5:
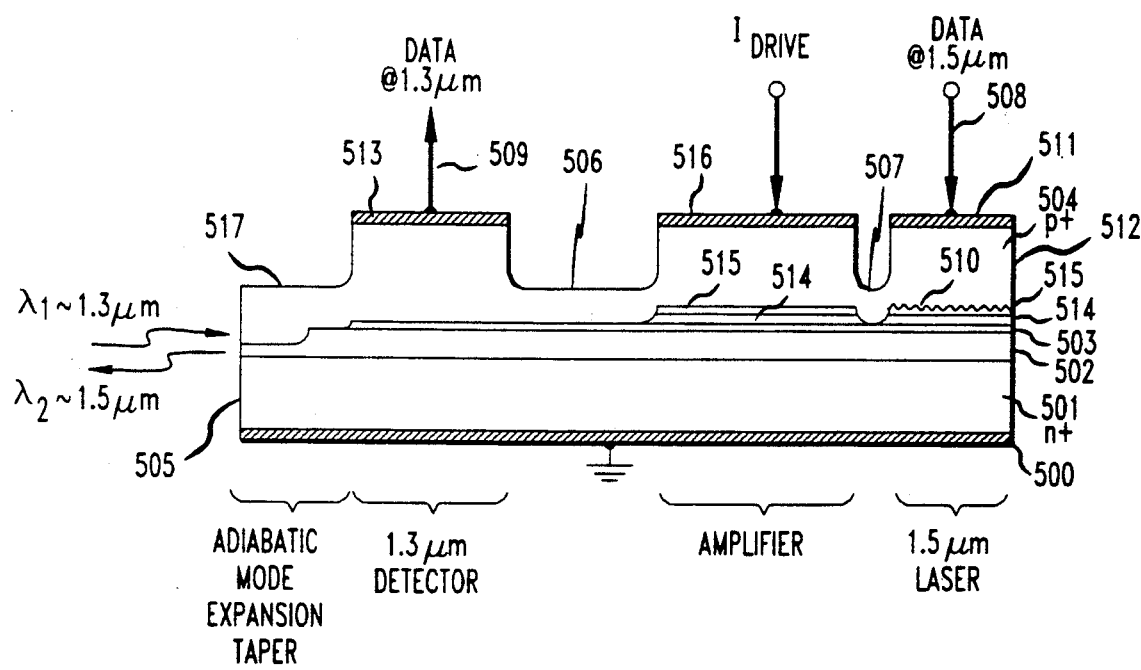

In an example from experimental practice, the photonic integrated transceiver circuit was integrated in a somewhat more complex photonic integrated circuit than the ones shown in the preceding FIGS. This exemplary embodiment is shown in FIG. 5. In the embodiment shown in FIG. 5, the photonic integrated circuit includes the transceiver along with an amplifier and adiabatic mode expansion taper. The adiabatic mode expansion (AME) taper is designed for expanding the optical mode at the input/output facet thereby allowing easy fiber coupling. The adiabatic mode expansion taper has been described in allowed U.S. patent applications Ser. Nos. 389,087 (Koch Case 11-6) and 389,074 (Koch Case 12-7), both of which are commonly assigned herewith. The teachings of these references are expressly incorporated herein by reference.

The semiconductor heterostructure shown in FIG. 5 comprises a plurality of layers wherein substrate and lower cladding layer 501 is an n+ InP layer; inline waveguide layer 502 is a substantially undoped InGaAsP having a set of mole fractions x and y ($In_{1-x}Ga_xAs_{1-y}P_y$) suitable for achieving a photoluminescence peak substantially at a wavelength which is shorter than $\lambda_1$, for example, 1.1 μm; another guiding layer 503 is a substantially undoped InGaAsP layer having mole fractions suitable for achieving a photoluminescence peak substantially at the shorter wavelength $\lambda_1$; gain layer 514 in the laser section is a substantially undoped InGaAsP layer having a set of mole fractions suitable for achieving a photoluminescence peak substantially at the longer wavelength $\lambda_2$; another guiding layer 515 is a substantially undoped InGaAsP layer having mole fractions suitable for achieving a photoluminescence peak substantially at the shorter wavelength $\lambda_1$; upper cladding layer 504 is a p+ InP; and electrical isolation is provided by grooves 506, 507 and 517. It is understood that each cladding layer comprises material having a lower refractive index than the inline waveguide layer in order to form a low loss optical waveguide.

Diffraction grating 510 for the distributed feedback laser is positioned on layer 515. The backside facet for the photonic integrated transceiver circuit is end facet 512.

In the laser portion of the transceiver, electrical connection is made through contacts 511 and 500; in the amplifier portion of the transceiver, electrical connection is made through contacts 516 and 500; and in the detector portion of the transceiver, electrical connection is made through contacts 513 and 500. Signals for the longer wavelength laser are applied to the laser via lead 508 and emanate from the device via facet 505. Signals from the shorter wavelength detector are received via lead 509 and are received to the device through facet 505.

Evaluation of the performance of this photonic integrated transceiver circuit was accomplished by installing it in a bidirectional fiber link communicating with a complementary hybrid end station. This hybrid was formed using a simple non-wavelength-selective fiber directional coupler with a 1.3 μm DFB transmitter laser on one arm and a p-i-n detector on the other arm. In this link, the detector on the photonic integrated transceiver circuit was connected directly to 50Ω 6 dB noise figure amplifiers. Even with the fiber coupling loss into the waveguide detector on the photonic integrated transceiver circuit and the very low sensitivity of the front end amplification, this link had ~7 dB of margin at 200 Mb/s and $10^{-9}$ bit-error-rate to potentially permit >30 km of fiber transmission. Included in these results is the penalty due to crosstalk between the high intensity longer wavelength (1.5 μm) transmitter signal passing directly through the shorter wavelength (1.3 μm) detector, which was only ~1 dB. Since most of the crosstalk appears to be related to the mount, at least at these margin levels, the integration technology is quite sound.

Although not shown in the FIGS., it is understood that lateral (transverse) confinement of the waveguides may be accomplished through standard mask and etch techniques. Typical lateral dimensions for the waveguides are approximately 0.5 μm to several μm.

Additional information concerning the multiple quantum well lasers employed in the photonic integrated transceiver circuits is found in *Electronics Letters*, Vol. 25, No. 19, pp. 1271-2 (1989).

By using bandgap discrimination in a proper sequence for each transmit/receive bidirectional wavelength-division-multiplexed end station, it has been shown how the transmitted light can actually pass through the operating detector without interference or cross-talk. By offering a simple geometry and combining all the optical devices onto a single chip with one fiber connection, photonic integrated circuits of this type should be attractive for cost-sensitive applications such as fiber to the home.

What is claimed is:

1. A semiconductor device for transmitting a first lightwave signal at a first wavelength and for receiving a second lightwave signal at a second wavelength, said semiconductor device comprising,
   a waveguide for supporting propagation of said first and second lightwave signals wherein said waveguide includes a semiconductor material layer having a photoluminescence wavelength less than or equal to said second wavelength,
   means for generating said first lightwave signal, and
   means for detecting said second lightwave signal from a portion of said waveguide, said second wavelength being less than said first wavelength,
   said waveguide being integral with said generating means and said detecting means, said generating means and said detecting means disposed collinearly along a longitudinal axis of said waveguide so that signals from said generating means propagate through said detecting means.

2. The semiconductor device as defined in claim 1 further comprising means for electrically isolating said generating means from said detecting means.

3. The semiconductor device as defined in claim 2 wherein the isolating means includes a body of semi-insulating semiconductor material disposed over said waveguide and between said generating means and said detecting means.

4. The semiconductor device as defined in claim 3 wherein the generating means includes a distributed feedback laser.

5. The semiconductor device as defined in claim 3 wherein the generating means includes a distributed Bragg reflector laser.

6. The semiconductor device as defined in claim 3 wherein the generating means includes a Fabry-Perot laser.

7. The semiconductor device as defined in claim 1 wherein said waveguide includes a lower cladding layer, a core waveguide layer formed on said lower cladding layer, and an upper cladding layer formed over said core waveguide layer wherein said upper and lower cladding layers provide optical confinement for the lightwave signals in the waveguide.

8. A lightwave communication system comprising at least first and second stations and means for interconnecting said stations, said first station for transmitting lightwave signals at a second wavelength and receiving lightwave signals at a first wavelength, said second station for transmitting lightwave signals at a first wavelength and receiving lightwave signals at a second wavelength, said second wavelength being less than said first wavelength, the communication system CHARACTERIZED IN THAT said second stations comprises a waveguide for supporting propagation of said first and second lightwave signals wherein said waveguide includes a semiconductor material layer having a photoluminescence wavelength less than or equal to said second wavelength, means for generating said first lightwave signal, and means for detecting said second lightwave signal from a portion of said waveguide, said waveguide being integral with said generating means and said detecting means, said generating means and said detecting means disposed colinearly along a longitudinal axis of said waveguide so that signals from said generating means propagate through said detecting means.

* * * * *